(12) United States Patent
    Liu

(10) Patent No.: US 10,284,197 B2
(45) Date of Patent: May 7, 2019

(54) KEY

(71) Applicant: ZTE CORPORATION, Shenzhen, Guangdong Province (CN)

(72) Inventor: Zhen Liu, Shenzhen (CN)

(73) Assignee: ZTE Corporation, Shenzhen, Guangdong Province (CN)

( * ) Notice: Subject to any disclaimer, the term of this patent is extended or adjusted under 35 U.S.C. 154(b) by 311 days.

(21) Appl. No.: 15/321,182

(22) PCT Filed: Aug. 12, 2014

(86) PCT No.: PCT/CN2014/084142
§ 371 (c)(1),
(2) Date: Dec. 21, 2016

(87) PCT Pub. No.: WO2015/196536
PCT Pub. Date: Dec. 30, 2015

(65) Prior Publication Data
US 2017/0155388 A1    Jun. 1, 2017

(30) Foreign Application Priority Data
Jun. 24, 2014 (CN) .................... 2014 2 0341226 U

(51) Int. Cl.
H03K 17/97 (2006.01)
H03K 17/965 (2006.01)
(52) U.S. Cl.
CPC ........... H03K 17/97 (2013.01); H03K 17/965 (2013.01)

(58) Field of Classification Search
CPC ........................... H03K 17/97; H03K 17/965
See application file for complete search history.

(56) References Cited

U.S. PATENT DOCUMENTS

| | | | | |
|---|---|---|---|---|
| 5,541,562 A * | 7/1996 | Fletcher | ............. | H01H 36/0046 335/205 |
| 5,631,530 A * | 5/1997 | Hoppe | ................... | G01D 5/145 318/268 |
| 6,356,741 B1 * | 3/2002 | Bilotti | ................ | H03K 17/9517 307/116 |

(Continued)

FOREIGN PATENT DOCUMENTS

| | | |
|---|---|---|
| CN | 101825945 A | 9/2010 |
| CN | 102263546 A | 11/2011 |

(Continued)

Primary Examiner — Thienvu V Tran
Assistant Examiner — Pinping Sun
(74) Attorney, Agent, or Firm — Ling Wu; Stephen Yang; Ling and Yang Intellectual Property

(57) ABSTRACT

A key is provided, including: a magnetic component arranged to generate a magnetic field; a closed loop, herein the closed loop includes a preset device in series connection and a conductor set in the magnetic field; a voltage drop detection chip, herein the voltage drop detection chip has two pins respectively connected to two ends of the preset device and an output port arranged to output a detected voltage drop signal between the two pins; and a key body movably connected on a supporting part, herein the key body is connected to the conductor, the key body can move in two opposite directions on the supporting part, and the key body drives the conductor to cut magnetic induction lines in the magnetic field during motion.

9 Claims, 3 Drawing Sheets

(56) References Cited

U.S. PATENT DOCUMENTS

| | | | | |
|---|---|---|---|---|
| 7,126,072 | B2* | 10/2006 | Saitoh | H03K 17/968 200/512 |
| 8,253,599 | B2* | 8/2012 | Yang | G01D 5/14 341/20 |
| 8,305,240 | B2* | 11/2012 | Xiao | H03K 17/952 341/20 |
| 2004/0151978 | A1* | 8/2004 | Huang | B82Y 25/00 429/83 |
| 2005/0258687 | A1* | 11/2005 | Zapf | A01K 67/0271 307/106 |
| 2008/0188712 | A1* | 8/2008 | Shimizu | A61B 1/00016 600/118 |
| 2011/0291864 | A1* | 12/2011 | Xiao | H03K 17/952 341/22 |
| 2012/0242464 | A1* | 9/2012 | Maier | G06F 3/016 340/407.2 |
| 2013/0335011 | A1* | 12/2013 | Bohringer | H02N 11/002 320/107 |
| 2018/0171941 | A1* | 6/2018 | Wiese | F02M 26/48 |

FOREIGN PATENT DOCUMENTS

| | | | | |
|---|---|---|---|---|
| DE | 2756547 | A1 | 6/1979 | |
| EP | 1630839 | B1 | 8/2007 | |
| WO | 2013086551 | A1 | 6/2013 | |
| WO | WO-2013086551 | A1* | 6/2013 | H01H 25/041 |

* cited by examiner

KEY

TECHNICAL FIELD

The present disclosure relates to the field of electronic technology, and in particular to a key.

BACKGROUND

There is a wide range of keys and switches of electronic products at present and implementation ways are also diversified, but basically snap joints, springs and capacitances are predominant, the keys and switches belong to devices which are used very frequently and thus they have strict requirements on the lifetime, for the existing switch implementation technology, it is required to add materials and processing costs to extend the wear life of contact parts of the switches, moreover, good hand feeling is not obtained in use and it is accompanied with certain noise, which influences the comfort use for the keys and reduces the user experience.

SUMMARY

The object of the embodiments of the present disclosure is to provide a key, so that contact parts are not needed when triggering corresponding functions of the key, which greatly extends the service life of the key; and meanwhile hand feeling is better when compared to a conventional key, which enhances the user experience.

In order to achieve the above object, the embodiment of the present disclosure provides a key, which includes:

a magnetic component arranged to generate a magnetic field;

a closed loop, herein the closed loop includes a preset device in series connection and a conductor set in the magnetic field;

a voltage drop detection chip, herein the voltage drop detection chip has two pins respectively connected to two ends of the preset device and an output port arranged to output a detected voltage drop signal between the two pins; and a key body movably connected on a supporting part, herein the key body is connected to the conductor, the key body moves in two opposite directions on the supporting part, and when the key body moves, the key body drives the conductor to cut magnetic induction lines in the magnetic field.

Alternatively, the key further includes:

an external circuit connected to the output port of the voltage drop detection chip, herein the external circuit includes a multiplexer arranged to gate a preset function according to the voltage drop signal output by the output port.

Alternatively, the magnetic component includes a first magnetic component and a second magnetic component placed opposite to the first magnetic component and with a preset distance from the first magnetic component; herein, magnetism of the first magnetic component and magnetism of the second magnetic component are opposite.

Alternatively, the conductor is a conductive disc with a hole, the key body is a rotation key connected to the conductive disc with the hole.

Alternatively, the conductive disc with the hole is serially connected in the closed loop through a first contact chip and a second contact chip respectively, the first contact chip and the second contact chip are fixedly set at two sides of the conductive disc respectively and electrically connected to the conductive disc, and when the rotation key rotates, the rotation key drives the conductive disc with the hole to rotate and cut magnetic induction lines in the magnetic field.

Alternatively, the conductor is a segment of a wire in the closed loop.

Alternatively, the key body is connected to the wire through a rotation axis, and when the key body moves, the rotation axis rotates and drives the wire to move and cut magnetic induction lines in the magnetic field.

Alternatively, the magnetic component is a magnetic sheet or a magnetic pillar.

Alternatively, the preset device is a resistor.

In the key of the embodiments of the present disclosure, the conductor in the closed loop moves and cuts the magnetic induction lines in the magnetic field by using the electromagnetic induction phenomenon, magnetic flux in the closed loop is changed, induced current is generated, the induced current generates voltage drops at two ends of the preset device in the closed loop, a state of the key is judged according to the voltage drops, functions of the key are implemented, and no contact parts are needed when the key is triggered, which greatly extends the service life of the key and reduces noise; and meanwhile hand feeling is better, which enhances the user experience.

PREFERRED EMBODIMENTS

The specific embodiments of the present disclosure will be described in detail in combination with the accompanying drawings below. It should be noted that the embodiments in the application and the characteristics in the embodiments can be arbitrarily combined with each other in the case of no conflict.

The embodiments of the present disclosure provide a key with respect to the problem in the existing technology that wear and tear of the key is severe, the service life is limited and it is accompanied with noise in use, a conductor in a closed loop moves and cuts magnetic induction lines in a magnetic field by using the electromagnetic induction phenomenon, magnetic flux in the closed loop is changed, induced current is generated, the induced current generates voltage drops at two ends of a preset device in the closed loop, a state of the key is judged according to the voltage drops, functions of the key are implemented, and no contact parts are needed when the key is triggered, which greatly extends the service life of the key and reduces noise; and meanwhile hand feeling is better, which enhances the user experience.

Figure 1:
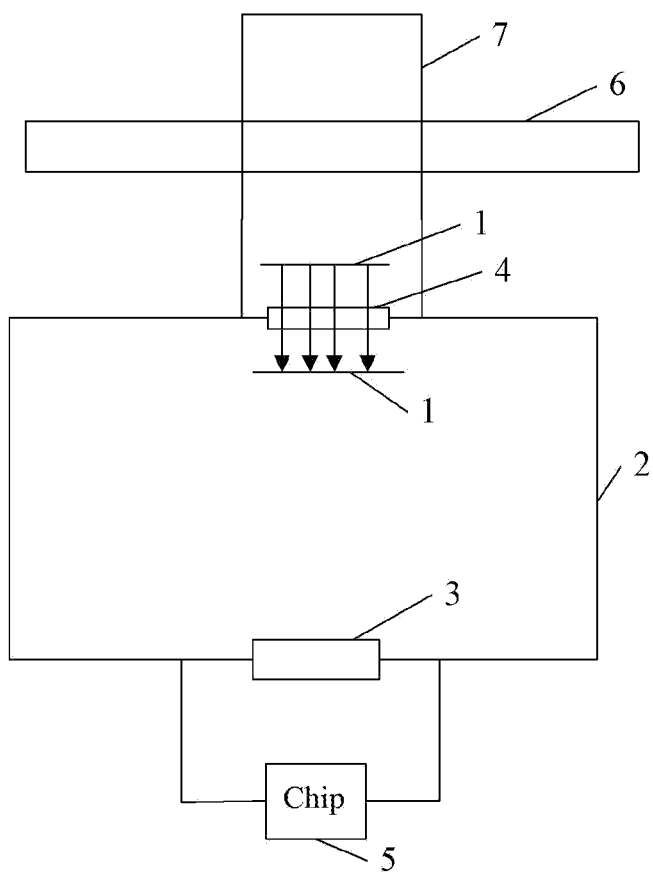
FIG. 1 represents a schematic diagram of a basic structure of a key according to an embodiment of the present disclosure.

As shown in FIG. 1, an embodiment of the present disclosure provides a key, which includes:

a magnetic component 1 arranged to generate a magnetic field;

a closed loop 2, herein the closed loop 2 includes a preset device 3 in series connection and a conductor 4 set in the magnetic field;

a voltage drop detection chip 5, herein the voltage drop detection chip 5 has two pins respectively connected to two ends of the preset device 3 and an output port used for outputting a detected voltage drop signal between the two pins; and a key body 7 movably connected on a supporting part 6, herein the key body 7 is connected to the conductor 4, the key body 7 can move in two opposite directions on the supporting part 6, and the key body 7 drives the conductor 4 to cut magnetic induction lines in the magnetic field during motion.

In the above embodiment of the present disclosure, the magnetic field is an invisible and impalpable special substance, but the magnetic field exists objectively, and the magnetic field has a radiation characteristic of wave particles. The magnetic field exists around magnetic bodies (magnetic components), and an interaction between the magnetic bodies uses the magnetic field as a medium. Since the magnetism of the magnetic bodies is from electric current, the electric current is movement of electric charges, thus the magnetic field is generated by variation of moving electric charges or electric fields in summary. The closed loop is an ensemble consisting of electrical devices and components connected in a certain way to provide a path for electric charge circulation. The electromagnetic induction phenomenon refers to a phenomenon that part of conductor in the closed circuit performs magnetic induction line cutting motion in the magnetic field and the conductor will generate current.

By using the electromagnetic induction phenomenon, the key body 7 moves on the supporting part 6 and drives the conductor 4 in the closed loop 2 to cut magnetic induction lines of the magnetic field generated by the magnetic component 1, magnetic flux in the closed loop 2 is changed, and induced current is generated; when the key body 7 moves in two opposite directions, pulse directions of the generated induced current are also opposite, positive and negative of the voltage drops generated at two pins of the voltage drop detection chip 5 are also opposite, and two voltage drops oppositely positive and negative of the voltage drop detection chip 5 are output via an output port of the voltage drop detection chip 5 to correspondingly implement two functions of the key.

In the above embodiment of the present disclosure, the key also includes:

an external circuit connected to the output port of the voltage drop detection chip, herein the external circuit includes a multiplexer arranged to gate a preset function according to the voltage drop signal output by the output port.

In the above embodiment of the present disclosure, specifically a corresponding state (a state 1 or a state 2) of the key is triggered according to the positive and negative of the voltage drop signal, thus the key provided by the present disclosure includes an external circuit, the state 1 or the state 2 respectively corresponds to different functions. Alternatively, a multiplexer is adopted to gate one preset function therein according to the voltage drop signal to implement corresponding functions of the key. Herein, the multiplexer is only one alternative embodiment in the embodiments of the present disclosure and it is not used for limiting the protection scope of the present disclosure, other methods that can correctly trigger the preset function are all applicable in the embodiments of the present disclosure, for example, it is implemented through monolithic processor programming or a doubly-selective switch, which will not be repeated here.

In the above embodiment of the present disclosure, the magnetic component 1 is a magnetic sheet or a magnetic pillar; the preset device is a resistance.

In the above embodiment of the present disclosure, the magnetic field may have various forms, then the magnetic component may also be various types, such as two magnetic sheets placed up and down and two magnetic pillars placed inside and outside and so on, which is not limited to a fixed form. Other ways that can generate the magnetic field are all applicable in the specific embodiments of the present disclosure.

Herein, the preset device is serially connected in the closed loop, the preset device may be a resistor or other electrical devices, and all components that can generate voltage at both ends of the components are applicable in the embodiment of the present disclosure.

In the above embodiment of the present disclosure, the magnetic field is constituted by a first magnetic component and a second magnetic component placed opposite to the first magnetic component and with a preset distance from the first magnetic component; herein, magnetism of the first magnetic component and magnetism of the second magnetic component are opposite. For example, the first magnetic component is an N pole, the second magnetic component is an S pole, and a magnetic induction line direction of the magnetic field points to the S pole from the N pole.

In the embodiment of the present disclosure, the preset distance between the first magnetic component and the second magnetic component is decided according to the volume of an object in which the key is located, Alternatively, the preset distance is greater than the thickness of the conductor 4 in the closed loop; the first magnetic component and the second magnetic component are oppositely placed, Alternatively, the first magnetic component and the second magnetic component are oppositely placed in parallel, and directions of the magnetic induction lines are vertical to the first magnetic component (or the second magnetic component). The direction of the conductor 4 in the closed loop 2 cutting the magnetic induction lines may be vertical to the directions of the magnetic induction lines or non-vertical to the directions of the magnetic induction lines, and all cutting directions that can enable the magnetic flux in the closed loop to be changed are applicable in the embodiments of the present disclosure, which is not limited to a fixed form.

Figure 2:
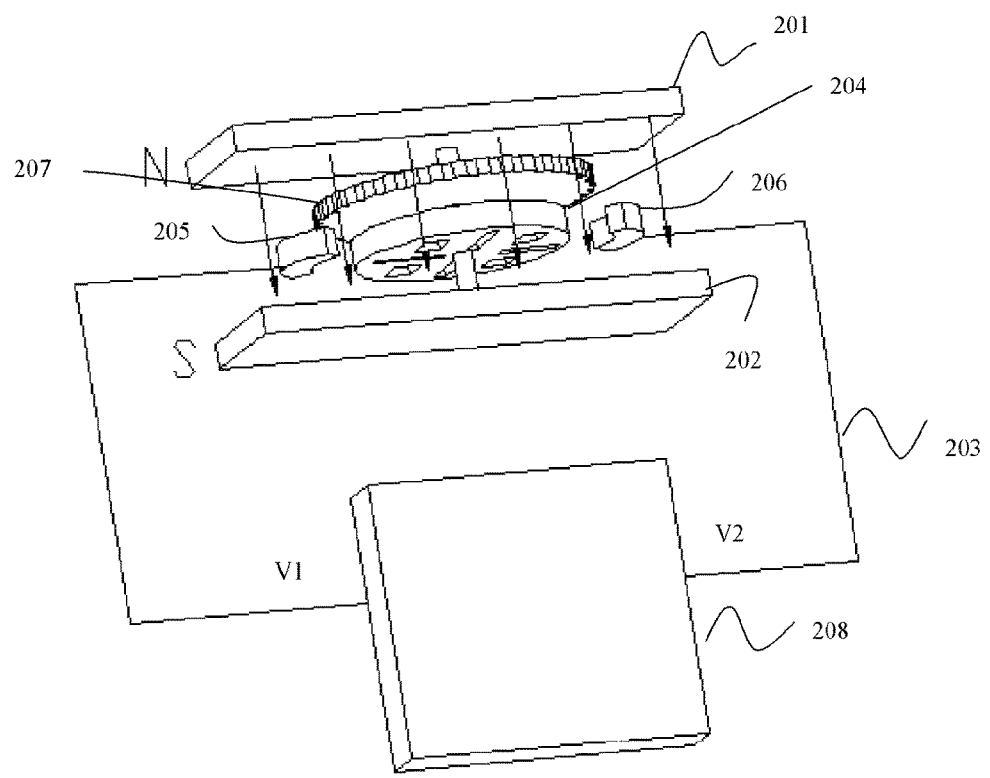
FIG. 2 represents a schematic diagram of a key in which a conductor in the form of a conductive disc cutting magnetic induction lines according to an embodiment of the present disclosure.

In a specific embodiment of the present disclosure, as shown in FIG. 2, the conductor 4 is a conductive disc 204 with a hole, the key body is a rotation key 207 connected to the conductive disc 204 with the hole.

Herein, the conductive disc 204 with the hole is serially connected in a closed loop 203 through a first contact chip 205 and a second contact chip 206 respectively, the first contact chip 205 and the second contact chip 206 are fixedly set at two sides of the conductive disc respectively and electrically connected to the conductive disc, the rotation key 207 drives the conductive disc 204 with the hole to rotate and cut magnetic induction lines in the magnetic field during rotation so as to generate induced current, and transfers the induced current to the closed loop 203 through the first contact chip 205 and the second contact chip 206.

As shown in FIG. 2, the key provided in the specific embodiment of the present disclosure includes a magnetic sheet 201 above and a magnetic sheet 202 below, the magnetic sheet 201 above and the magnetic sheet 202 below form the magnetic field with a magnetic induction line direction from top to bottom and the closed loop 203, part of conductor 204 in the closed loop is a conductive disc 204 with a gate hole in FIG. 2, the conductive disc 204 with the grid hole is only for explaining the alternative embodiment of the present disclosure and the part is not limited to the disc with the grid hole, since the conductive disc 204 with the grid hole is required to rotate, in order to make the disc 204 and the closed loop 203 be connected well and not to affect the rotation of the disc 204, a crescent-shaped first contact chip 205 and a crescent-shaped second contact chip 206 and a rotation key 207 used for driving the conductive disc 204 with the grid hole to rotate, and a voltage drop collecting chip 208 are used. When the rotation key 207 is stirred clockwise, the conductive disc 204 with the gate hole is driven to clockwise cut the magnetic induction lines, the induced current is in an anticlockwise direction in the closed loop at this point according to a right-hand rule, the induced current is transferred to two ends of the voltage drop collecting chip 208 through the first contact chip 205 and the second contact chip 206, voltage V2 of two pins of the voltage drop collecting chip 208 in the closed loop is less than V1 and it is judged that the key is in the state 1. When the auxiliary rotation key 207 is stirred anticlockwise, the conductive disc 204 with the gate hole is driven to clockwise cut the magnetic induction lines, the induced current is in a clockwise direction in the closed loop at this point according to the right-hand rule, the induced current is transferred to two ends of the voltage drop collecting chip 208 through the first contact chip 205 and the second contact chip 206, voltage V2 of two pins of the voltage drop collecting chip 208 in the closed loop is greater than V1 and it is judged that the key is in the state 2, and the state 1 and state 2 of the key may be respectively and correspondingly implemented with different functions, and the different functions may be preset according to the actual needs.

Figure 3:
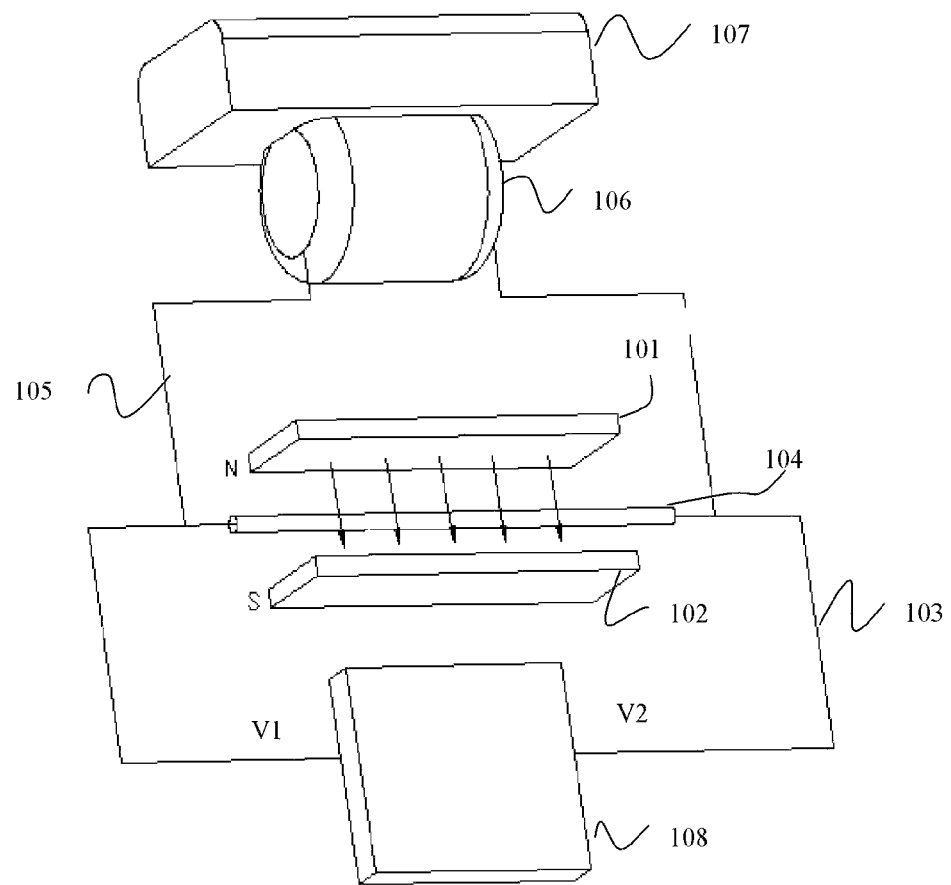
FIG. 3 represents a schematic diagram of a key in which a conductor in the form of a wire cutting magnetic induction lines according to an embodiment of the present disclosure.

In the above embodiment of the present disclosure, as shown in FIG. 3, the conductor is a segment of a wire 104 in the closed loop.

A key body 107 is connected to the wire 104 through a rotation axis 106, and the rotation axis 106 rotates and drives the wire 104 to move and cut magnetic induction lines in the magnetic field when the key body 107 moves, so as to generate induced current in the closed loop.

As shown in FIG. 3, the key provided in the specific embodiment of the present disclosure includes a magnetic sheet 101 above and a magnetic sheet 102 below, the magnetic sheet 101 above and the magnetic sheet 102 below form a magnetic field with a magnetic induction line direction from top to bottom and a closed loop 103, part of conductor 104 in the closed loop is a wire in FIG. 3 and it is only for explaining the alternative embodiment of the present disclosure, and the part is not limited to the wire, a structure frame 105 with the wire 104 and the key body 107 being connected, the rotation axis 106, the key body 107 and a voltage drop collecting chip 108. When the key body 107 moves backward, the wire 104 moves forward to perform forward cutting by virtue of the rotation axis 106, according to the right-hand rule, the right hand is stretched evenly to make the thumb be vertical to the rest four fingers, and all the fingers are within one plane with palm; the right hand is put in the magnetic field, if the magnetic induction lines vertically enter the palm (when the magnetic induction lines are straight lines, it is equivalent to that the palm faces the N pole), the thumb points to a movement direction of the wire, then a direction to which the four fingers point is a direction of the induced current in the wire, the induced current is in a clockwise direction at this point, voltage V2 of two pins of the voltage drop collecting chip 108 in the closed loop is greater than V1 and it is judged that the key is in the state 1; and when the key body 107 moves forward, the wire 104 moves backward through the rotation axis 106 and the structure frame 105 to perform backward cutting, according to the right-hand rule, the induced current is in an anticlockwise direction at this point, voltage V2 of two pins generated at two ends of the voltage drop collecting chip 108 is less than V1 and it is judged that the key is in the state 2, and the state 1 and state 2 of the key may be respectively and correspondingly implemented with different functions, and the different functions may be preset according to the actual needs.

It should be noted that the magnetic field may also be generated by other modes in the specific embodiments of the present disclosure, for example, the magnetic field is generated by a magnetic body that can change energy of the magnetic field or the magnetic field is generated by a magnetic body that can change a direction of the magnetic field. For such type of magnetic fields, the purpose of changing the magnetic flux of the closed loop to generate induced current may be achieved by directly changing the energy or direction of the magnetic field, and the functions of the key provided by the present disclosure may also be implemented.

The above description is the alternative embodiments in the present disclosure, it should be pointed that a plurality of improvements and modifications may also be made in the premise of not departing from the principle of the present disclosure for those ordinary people skilled in the art, and all these improvements and modifications shall also be within the protection scope of the present disclosure.

INDUSTRIAL APPLICABILITY

In the key of the embodiments of the present disclosure, the conductor in the closed loop moves and cuts the magnetic induction lines in the magnetic field by using the electromagnetic induction phenomenon, magnetic flux in the closed loop is changed, induced current is generated, the induced current generates voltage drops at two ends of the preset device in the closed loop, a state of the key is judged according to the voltage drops, functions of the key are implemented, and no contact parts are needed when the key is triggered, which greatly extends the service life of the key and reduces noise; and meanwhile hand feeling is better, which enhances the user experience.

What I claim is:
1. A key, comprising:
   a magnetic component arranged to generate a magnetic field;
   a closed loop, wherein the closed loop includes a preset device in series connection with a conductor, and the conductor is set in the magnetic field;
   a voltage drop detection chip, wherein the voltage drop detection chip has two pins respectively connected to two ends of the preset device and an output port arranged to output a detected voltage drop signal between the two pins; and
   a key body movably connected on a supporting part, wherein the key body is connected to the conductor, the key body moves in two opposite directions on the supporting part, and when the key body moves, the key body drives the conductor to cut magnetic induction lines in the magnetic field.

2. The key according to claim 1, further comprising:
an external circuit connected to the output port of the voltage drop detection chip, wherein the external circuit includes a multiplexer arranged to gate a preset function according to the voltage drop signal output by the output port.

3. The key according to claim 1, wherein, the magnetic component comprises a first magnetic component and a second magnetic component placed opposite to the first magnetic component and with a preset distance from the first magnetic component; wherein, magnetism of the first magnetic component and magnetism of the second magnetic component are opposite.

4. The key according to claim 1, wherein, the conductor is a conductive disc with a hole, the key body is a rotation key connected to the conductive disc with the hole.

5. The key according to claim 4, wherein, the conductive disc with the hole is serially connected in the closed loop through a first contact chip and a second contact chip respectively, the first contact chip and the second contact chip are fixedly set at two sides of the conductive disc respectively and electrically connected to the conductive disc, and the rotation key drives the conductive disc with the hole to rotate and cut magnetic induction lines in the magnetic field during rotation.

6. The key according to claim 1, wherein, the conductor is a segment of a wire in the closed loop.

7. The key according to claim 6, wherein, the key body is connected to the wire through a rotation axis, and the rotation axis rotates and drives the wire to move and cut magnetic induction lines in the magnetic field when the key body moves.

8. The key according to claim 1, wherein, the magnetic component is a magnetic sheet or a magnetic pillar.

9. The key according to claim 1, wherein, the preset device is a resistor.

* * * * *